(12) United States Patent
Freedman

(10) Patent No.: US 7,208,191 B2
(45) Date of Patent: Apr. 24, 2007

(54) STRUCTURE WITH HEAT DISSIPATING DEVICE AND METHOD

(76) Inventor: Philip D. Freedman, 6000 Wescott Hills Way, Alexandria, VA (US) 22315-4747

( * ) Notice: Subject to any disclaimer, the term of this patent is extended or adjusted under 35 U.S.C. 154(b) by 518 days.

(21) Appl. No.: 10/127,585

(22) Filed: Apr. 23, 2002

(65) Prior Publication Data

US 2003/0198021 A1 Oct. 23, 2003

(51) Int. Cl.
*B05D 5/12* (2006.01)
*C23C 16/00* (2006.01)

(52) U.S. Cl. .................. 427/58; 427/249.1

(58) Field of Classification Search ............ 427/58, 427/122, 249.1
See application file for complete search history.

(56) References Cited

U.S. PATENT DOCUMENTS

| | | |
|---|---|---|
| 4,769,557 A | 9/1988 | Houf et al. |
| 5,313,099 A | 5/1994 | Tata et al. |
| 5,338,571 A | 8/1994 | Mirkin et al. |
| 5,374,463 A | 12/1994 | Bethune et al. |
| 5,397,919 A | 3/1995 | Tata et al. |
| 5,864,465 A | 1/1999 | Liu |
| 5,876,684 A | 3/1999 | Withers et al. |
| 5,965,267 A | 10/1999 | Nolan et al. |
| 6,244,331 B1 | 6/2001 | Budelman |
| 6,255,241 B1 | 7/2001 | Miyazawa et al. |
| 6,277,438 B1 | 8/2001 | Olivas |
| 6,667,548 B2 * | 12/2003 | O'Connor et al. .......... 257/712 |
| 6,783,589 B2 | 8/2004 | Dahl |
| 2001/0027855 A1 | 10/2001 | Budelman |
| 2001/0055700 A1 * | 12/2001 | Dykes et al. ......... 428/694 TC |
| 2002/0001680 A1 * | 1/2002 | Hoehn et al. ............... 427/551 |
| 2002/0001689 A1 | 1/2002 | Takeuchi et al. |
| 2002/0030973 A1 | 3/2002 | Scafidi |

* cited by examiner

*Primary Examiner*—Brian K. Talbot
(74) *Attorney, Agent, or Firm*—Philip D. Freedman

(57) ABSTRACT

A structure comprises a thermal energy generating component and a thermal dissipating device in thermal conductive contact with the component, the device comprising a substrate with a fullerene coating. A method of producing a computer comprises applying a layer of fullerene onto a substrate and disposing the substrate in a heat dissipation relationship to a microprocessor.

18 Claims, 2 Drawing Sheets

STRUCTURE WITH HEAT DISSIPATING DEVICE AND METHOD

BACKGROUND OF THE INVENTION

The invention relates to a structure with a thermal dissipating device, to a method to produce a computer with a thermal dissipating device and to an electronic module with a thermal dissipating device.

Electronic components can generate large amounts of heat that can affect their operation. Particularly components used in computer systems, generate large amounts of heat. For example, the following are some typical maximum central processing unit operating temperatures for various computer microprocessors: 1.3 GHz-69° C.; 1.4 GHz-70° C.; 1.5 GHz-72° C.; 256 or 512K L2 cache-85° C.; and 1 MB L2 cache-80° C. The component temperature must be maintained within the maximum operating temperature to optimize device performance and reliability. A component can fail if its temperature exceeds the limit.

A component can be kept within an operating temperature limit by transferring generated heat away from the component to ambient environment, usually the surrounding room air. The heat transfer can be accomplished for example, by associating a thermal dissipating device such as a heat sink, with the component. A heat sink is a thermal dissipating device that comprises a structure, generally metal, that is thermally coupled to a heat source such as a microprocessor. The heat sink draws heat energy away from the heat source by conduction of the energy from a high-temperature region to the lower-temperature region of the heat sink. All modem microprocessors require a thermal dissipating device. Some require the thermal dissipating device in combination with a fan. A heat sink without a fan is called a passive heat sink; a heat sink with a fan is called an active heat sink.

Improved heat dissipation can be achieved by increasing the surface area of the thermal dissipating device or by increasing fluid flow over the device. One technique to improve efficiency of a conductive heat sink is to provide a greater surface area on the heat sink, typically by providing fins that are formed on a base portion. The fins dissipate additional energy from the heat sink into the atmosphere by natural (or free) convection. The thermal efficiency of a heat sink can be further increased by employing forced convection wherein a flow or stream of fluid, typically a gas such as air, is forced over and around the surface of the fins.

As central processing unit components such as microprocessor semiconductors, become smaller, they run faster, do more and generate more heat. The heat dissipating challenge becomes more acute. Currently, there is a need for an improved heat dissipating device that dissipates greater amounts of heat per unit size and for a method of producing such a structure within cost constraints.

BRIEF DESCRIPTION OF THE INVENTION

The invention provides a structure with a device that dissipates the large amounts of heat per unit size necessary to cool modem day thermal energy generating components such as microprocessor semiconductors. A structure according to the invention, comprises a thermal energy generating component and a thermal dissipating device in thermal conductive contact with the component. The thermal dissipating device comprises a substrate with a fullerene coating.

The invention is also a method of producing a computer, comprising applying a layer of fullerene onto a substrate and disposing the substrate in a heat dissipation relationship to a microprocessor.

Also, the invention relates to an electronic module, comprising a thermal energy generating component and a thermal dissipating device in thermal conductive contact with the component, the device comprising a substrate with a fullerene coating.

Further the invention relates to a method of producing an electronic module, comprising providing a thermal energy generating component and associating a thermal dissipating device comprising a substrate with a fullerene coating into thermal conductive contact with the component.

Finally the invention relates to a method of applying a fullerene coating to a substrate comprising applying a fullerene coating to a first higher melting temperature substrate to produce a first fullerene coated substrate; contacting the first fullerene coated substrate with a lower melting temperature substrate with a first surface in contact with an exposed fullerene surface of the fullerene coated substrate to form a two substrate structure with intermediate fullerene coating between the substrates; applying a second fullerene coating to an exposed surface of the second substrate; and cleaving the intermediate fullerene coating between the two substrates is cleaved to produce two fullerene coated substrates, at least one of which is the lower melting temperature substrate.

DETAILED DESCRIPTION OF THE INVENTION

Figure 1:
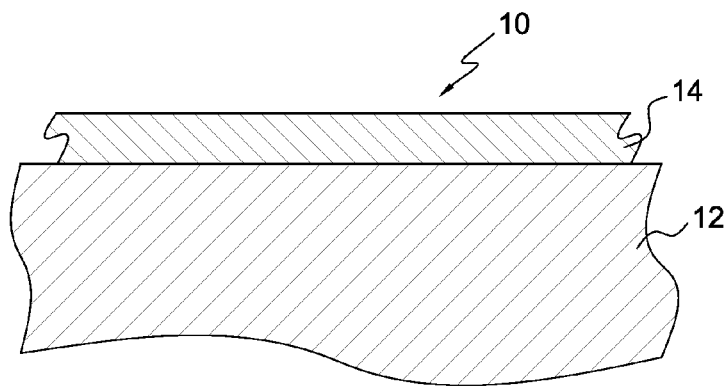
FIG. 1 is a schematic representation of a substrate with a fullerene coating.

According to the invention, a fullerene coated substrate provides a thermal dissipation structure having improved surface area and fluid flow thermal transfer characteristics resulting in high efficiency. In this application, fullerene "coating" means a covering fullerene layer. The fullerene coating is a contiguous and substantially continuous layer spread onto the substrate as opposed to a layer that may include fullerene molecules, some of which may have some incidental contact with the substrate. For example, a fullerene containing adhesive layer used to adhere a semiconductor component onto a heat sink substrate is not a fullerene coating within the definition of the invention. The nanotubes of the present invention would provide a thermal bridge through the adhesive layer used to adhere the semiconductor components.

Fullerenes are a class of carbon molecules having an even number of carbon atoms arranged in the form of a closed hollow cage, typically spheroid, wherein the carbon—carbon bonds define a polyhedral structure reminiscent of a soccer ball. The most well studied fullerene is $C_{60}$, buckminsterfullerene. Other known fullerenes include $C_{70}$ and $C_{84}$.

The substrate can be a semiconductive material or a metal such as a conventional heat sink material such as aluminum, copper or alloy thereof. An aluminum sheet is a preferred substrate because of its advantageous mechanical and heat transmitting characteristics. In general, pure aluminum has better thermal conductivity than an alloy. However, aluminum alloy is preferred because of its better mechanical characteristics. The substrate can be a base plate with a copper inlay and aluminum fins.

The heat transmission of the fullerene coating can be as high as 6000 watts per meter per Kelvin at room temperature. The fullerene coating of the invention is so remarkably heat transmissive that it permits the use of substrate materials that can be chosen for characteristics and properties other than heat conductibility. Hence according to one aspect of the invention, the substrate can be a thermal non-conducting or insulating material. In this instance, a substrate material can be selected for its structural or electrical insulating properties. Hence, the substrate can be a steel that is selected because it is a desirable construction material. Other suitable substrate materials include polymers and plastics such as polystyrenes and poyurethanes, which may be attractive because of their light weight or polyvinyl chlorides, which otherwise would be unsuitable because of thermal instability. Other suitable substrate materials include polycarbonates and polymethacrylates, which may be visually desirable or attractive. Even polyethylene and polypropylene films may be selected as suitable because of their lightweight and/or flexibility.

Contact between the heat dissipating device such as a heat sink, and the substrate for example a microprocessor surface, is important to effective dissipation. The surfaces of the heat sink and the microprocessor are never entirely flat. An interface between a directly applied heat sink and the microprocessor will have tiny air gaps. Since air conducts heat poorly, these gaps can have a very negative effect on the heat transfer. Usually, an interface material with a high thermal conductivity is applied to fill these gaps to improve heat conductivity. Common interface materials include graphite pads, silicone, zinc oxide, aluminum oxide or aluminum nitride thermal compounds or thermal tapes.

In one embodiment, a fullerene heat sink can be used without an interface material. Since the fullerene coating can be applied in a thickness as small as a single molecule, it provides a direct interface contact between heat sink and microprocessor with few if any air gaps to provide a high thermal conductivity relationship without an interface material. In one aspect, the present invention is a heat dissipating structure comprising a surface with a directly applied fullerene coating. By the term "directly applied" is meant a coating applied to a substrate without an intervening interface material between the coating and substrate.

The fullerene coating can be applied onto the substrate for example by the Langmuir-Blodgett (LB) technique or by a solution evaporation technique using solutions of $C_{60}$ dissolved in non-polar organic solvents such as benzene, toluene, etc. These processes form physisorbed films.

These and other features will become apparent from the drawings and following detailed discussion, which by way of example without limitation describe preferred embodiments of the invention. In the drawings, corresponding reference characters indicate corresponding parts throughout the several figures.

FIG. 1 shows a thermal dissipating device 10 comprising a substrate 12 with a fullerene coating 14. The coating 14 can be applied by any suitable method. In a preferred embodiment, the fullerene coating is applied by sublimation. In one process, the fullerene is sublimed from a powder by heating to a temperature greater than about 450° C. under low pressures, preferably less than about $1\times10^{-6}$ torr. The preferred sublimation temperatures are from about 450° C. to about 550° C. In one process, the fullerene powder is heated to a first lower temperature, preferably from about 200° C. to about 350° C. to remove any solvent or other impurities. In this process, the sublimation step can be conducted at less of a reduced pressure but at a higher temperature. However, it is preferred that the sublimation step is conducted at lower pressure, preferably less than about $1\times10^{-8}$ torr.

In the process, the fullerene powder is placed in a porous container or tube and the substrate is placed at the tube or container opposite end. The substrate surface is protected while the powder is brought to sublimation temperature and pressure. When the sublimation pressure and temperature are reached, the substrate surface is exposed while maintained at a lower temperature. The sublimed fullerene vapor condenses onto the substrate surface and forms to the substrate surface material. In an embodiment, the substrate is swept past the fullerene powder source at a rate to provide desired condensation and coating. Exposure time and sublimation conditions can be controlled to provide a desired fullerene coating thickness on the substrate surface.

In another embodiment, the fullerene coating is deposited by sublimation from a solution. In this process, fullerene is dissolved in toluene and the resulting solution is loaded into a resistively heated stainless steel tube oven. The oven is placed into a vacuum chamber, which is evacuated to approximately $10^{-6}$ Torr. The oven is then heated to about 150° C. for five minutes. A substrate is rotated above the tube oven opening. The tube is then further heated to at least 450° C., preferably to approximately 550° C. to sublime the fullerene from the solvent onto the substrate surface.

Suitable vacuum chambers for the sublimation include ultrahigh vacuum chambers operating at pressures of no more than about $1\times10^{-7}$ torr. However, to minimize contamination, it is desirable to conduct the sublimation process in a vacuum chamber operating at a pressure less than about $1\times10^{-8}$ torr and preferably in a chamber that operates at less than about $1\times10^{-10}$ torr.

In some applications, a thin monolayer fullerene coating may be desirable to provide an effective heat dissipating structure without changing substrate properties and without adding significant substrate weight or volume. In these applications, a thin, even mono-molecular layer can be applied according to one or more procedures. In one procedure, the monolayer coating is formed by depositing a coating of fullerene molecules onto the substrate and removing layers of the coating to produce a residual layer of desired thickness. The layers are removed by selectively breaking fullerene-to-fullerene intermolecular bonds without breaking the fullerene-to-substrate association or bonding and without subjecting the coating or substrate to injurious temperatures.

Fullerenes strongly bond to the substrate surface. Indeed, the fullerenes bond to a metal semiconductor substrate surface is stronger than inter molecular bonding among fullerene molecules. Excess fullerenes beyond a desired thickness such as a monolayer can be thus selectively removed by heating to a temperature sufficient to break the fullerene—fullerene bonds without disrupting the fullerene monolayer.

Desorption temperature is related to bond strength among fullerene molecules or between fullerenes and substrate. Hence, strength of fullerene bonding can be estimated by the temperature at which the fullerenes desorb. For multilayer fullerene molecules on a substrate, fullerene desorbtion temperature is between 225° C. and 300° C. Hence, an applied temperature of higher than 225° C., desirably at least 350° C. and in some applications up to about 450° C. will effect fullerene desorbtion without disrupting the fullerene to substrate bond. In one process, desorption of excess fullerenes beyond a monolayer can be achieved by heating at a temperature from about 225° C. to about 300° C.

Other methods of selectively breaking the fullerene intermolecular bond include laser beam, ion beam or electron beam selective irradiation. For example, an energetic photon laser beam, electron beam or inert ion beam can be irradiated onto the coated substrate with a controlled energy that is sufficient to break fullerene-to-fullerene intermolecular bonds without breaking fullerene-to-substrate associations or bonds. The parameters of the beam irradiation depend upon the energy, flux and duration of the beam and also depend on the angle of the beam to the fullerene coating. In general, the energy of irradiation is controlled to avoid fullerene molecule decomposition or reaction and to avoid excessive local heating. For example, it is preferred to operate a laser at an energy outside of the ultraviolet range preferably in the visible or infrared range, to avoid reacting fullerene molecules. On the other hand, the laser can be effectively operated in the ultraviolet range to cleave fullerene layers so long as operating conditions such as temperature, pressure and pulsation are controlled. In a preferred embodiment, the laser or other light source is operated in the visible or infrared portion of the spectrum. Light intensity and beam size can be adjusted to produce the desired desorption rate of fullerenes beyond a desired layer thickness such as a monolayer thickness.

If a sublimation step is used to form the initial fullerene coating, the fullerene layers can be cleaved to a desired thickness in the same vacuum chamber where the substrate surface is cleaned and the fullerene coating is deposited. Maintaining the substrate under vacuum keeps it clean and reduces beam scattering during irradiation. Additionally the vacuum can prevent fullerene recondensation by removing desorbed fullerene from the irradiation area.

An ion beam is generated by bombarding a molecular flow with high energy electrons that produce an ionization. The ion beam can be directed with electrodes. If an ion beam is used, beam energy and flux should be low enough to avoid decomposing the fullerene or forming higher-ordered fullerene molecules. For example, acceleration voltage can be as high as 3.0 kilovolts for some applications. Desirably, the voltage is between 50 and 1000, and preferably between about 100 and 300 volts. The beam current density can be in the range of about 0.05 to 5.0 mA/cm$^2$ (milliAmperes per square centimeter).

If a gas cluster ion beam is employed, ion clusters are used that have an atomic mass approximating that of the fullerene molecules. A $C_{60}$ fullerene molecule has an atomic mass unit (AMU) of 720. Beams of clustered ions approximating the mass of the fullerene molecules can be used to inject energy into the multilayer fullerene coating to break the fullerene-to-fullerene intermolecular bond without depreciating the fullerene molecules. Clusters can be formed by expanding an inert gas such as argon, through a supersonic nozzle followed by applying an electron beam or electric arc to form clusters.

The angle of incidence of a directed beam to the fullerene coating can be varied to control cleavage of dissociation. In one embodiment, a beam angle relative to irradiated target can be selected between about 25° and about 75°, preferably between 40° and 65°. When ion beam irradiation is used, incident angle is determined by balancing factors such as removal efficiency and precision.

Oxidation of a metal or semiconductor substrate surface can substantially reduce bonding strength and effectiveness of the fullerene coating. Metal surfaces are particularly susceptible to oxidation; hence a metal substrate surface should be cleaned prior to applying the fullerene coating. Surface cleaning can be by $Ar^+$ sputtering at about 0.1 to about 10 keV, by electron bombardment or by polishing. The substrate can be annealed by heating following cleaning to ensure a smooth uniform surface. A polishing step should be selected to avoid the introduction of other contaminants. For example, ceramic particles without a solvent or with a nonaqueous solvent are suitable polishing compositions.

In one embodiment, a clean substrate is assured by both cleaning the substrate and applying the fullerene coating within the same common controlled environment. The controlled environment can be a vacuum chamber such as an ultrahigh vacuum chamber where gaseous impurities are eliminated by operating at low pressures. In other types of air-tight chambers, impurities can be eliminated by purging with an inert gas, such as argon. The gas should be substantially free from water vapor and oxygen. Suitable chambers are available commercially for adaptation to the present process.

In one aspect of the invention, it has been found that fullerene coatings can be applied to certain substrates that would otherwise be damaged by the conditions of coating application. For example, fullerenes cannot be applied to certain lower melting substrates that would otherwise be damage because of the high temperature requirements for fullerene sublimation. According to this embodiment of the invention, a method of applying a fullerene coating to a substrate that melts at a temperature lower than the application temperature of the fullerene coating (lower melting substrate) comprises first applying a fullerene coating to a first higher melting temperature substrate (melting at a temperature higher than the application temperature of the coating) to produce a first fullerene coated substrate. The first fullerene coated substrate is placed in contact with a lower melting temperature substrate with a first surface in contact with an exposed fullerene surface of the fullerene coated substrate to form a two substrate structure with intermediate fullerene coating between the substrates. A second fullerene coating is then applied to an exposed surface of the second substrate and the intermediate fullerene coating between the two substrates is cleaved to produce two fullerene coated substrates, one of which is the lower melting temperature substrate. The intermediate fullerene coating functions to dissipate heat away from the lower melting structure while the second coating is applied at a temperature that otherwise could damage the lower melting substrate.

Fullerenes are commercially available from SES Research, Houston, Tex. Alternatively, there are well known ways of synthesizing fullerenes. For example, arc heating of graphite in an inert atmosphere, such as 150 torr He, results in carbon clusters from which fullerenes can be extracted with hot toluene. Fullerenes can be further purified by column chromatography of organic dispersions of fullerenes, such as with silica or alumna columns, to produce purified fullerenes.

Figure 2:
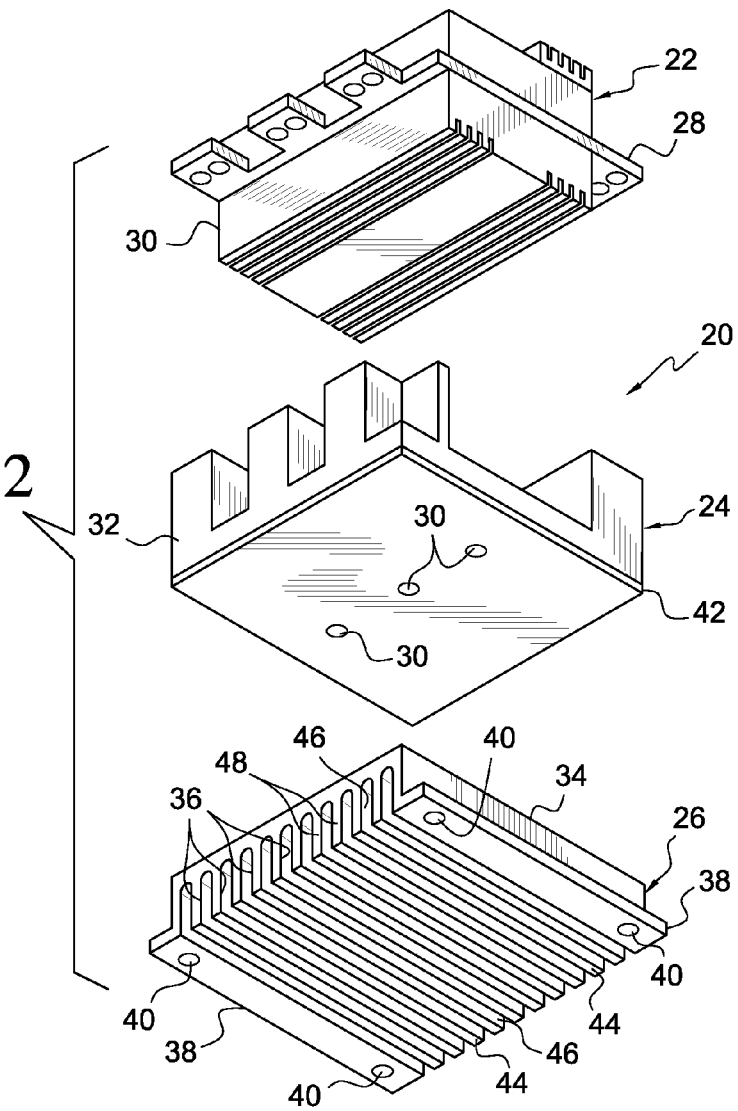
FIG. 2 is an exploded perspective view of a modular controller for operating an electric load such as a motor.
Figure 3:
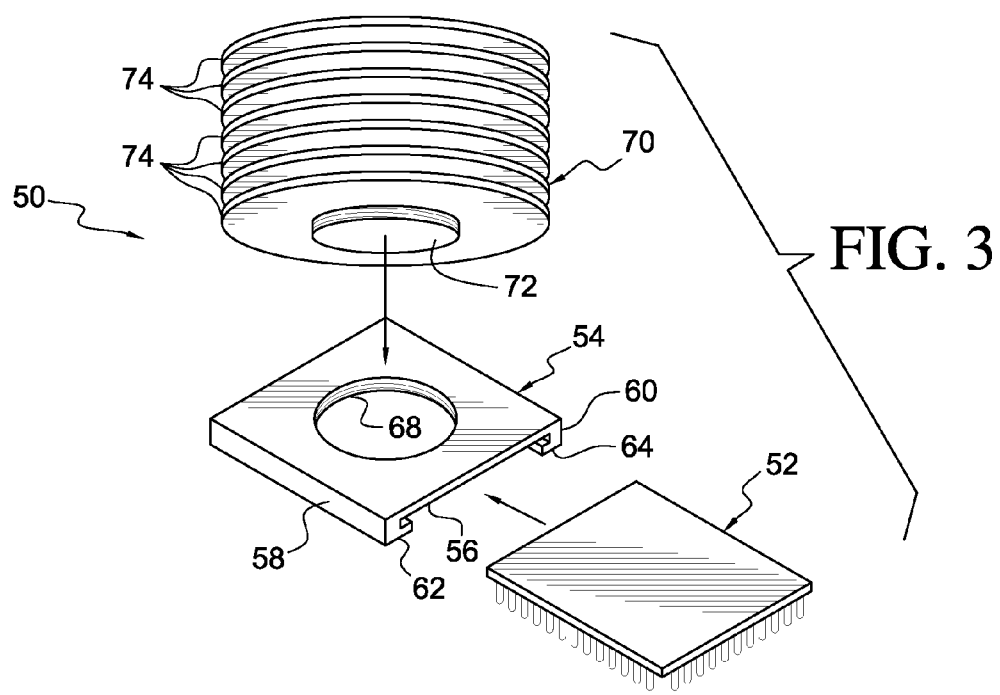
FIG. 3 is an exploded perspective view of central processing unit.
Figure 4:
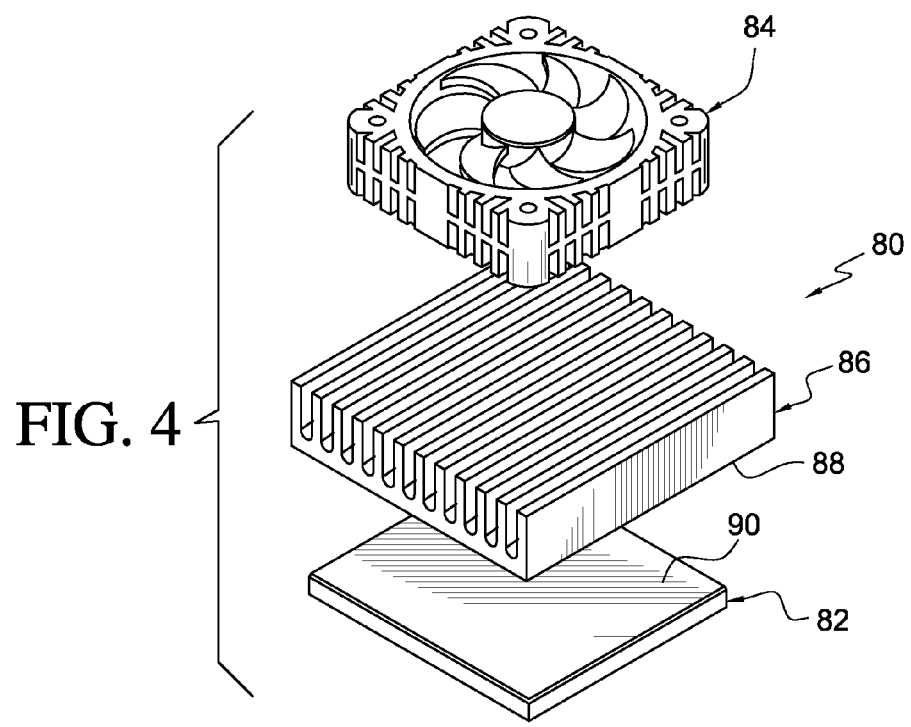
FIG. 4 is an exploded perspective view of a microprocessor assembly.

Once the coatings are completed, the substrates can be removed from the controlled environment. The fullerene coated substrates are then used as thermal dissipating devices in various applications. FIGS. 2 to 4 show thermal energy generating components 22, 52 and 82 in thermal conductive contact with respective fullerene thermal dissipating devices 26, 70 and 86. FIG. 2 shows a modular controller 20 for operating an electric load such as a motor, FIG. 3 shows a central processing unit 50 and FIG. 4 shows a microprocessor assembly 80.

In FIG. 2, modular controller 20 comprises a control logic module 22, electrical power switching assembly 24 and a heat dissipating device, which is heat sink 26. The module 22 includes an electronic circuit (not shown) for controlling the operation of an electric motor. The module comprises an electrically insulating enclosure 28 with a rectangular lower portion 30. Power switching assembly 24 comprises switching modules 32 positioned side by side beneath the control logic module 22 to control electric power for a motor. The assembly 24 also includes contact plate 42 extending along the assembly 24 bottom surface. The assembly 24 includes apertures 30 through contact plate 42 for receiving connectors (not shown) for fastening to heat sink 26.

Heat sink 26 can be formed of an underlying heavy gauge metal having a high thermal capacity or according to one embodiment of the invention, the heat sink 26 is formed from a structural material that has little or no thermal capacity. The heat sink 26 can be in any suitable heat dissipating configuration. In FIG. 2, the heat sink 26 has a flat base 34 with a plurality of extending fins 36. The heat sink 26 has a flange 38 with apertures 40 for mounting the heat sink 26 and the entire modular motor controller 20 within an electrical control panel.

The contact plate 42 provides an interface between switching assembly 24 and heat sink 26. The contact plate surface can be fullerene coated as shown in FIG. 1, to provide improved heat dissipation from the switching assembly 44. The heat sink fins 36 provide extending surfaces to dissipate heat away from the switching assembly 24. Each fin 36 comprises a lateral surface 44, extending surfaces 46 and end surface 48. The fin surfaces 44, 46 and 48 provide air contact for increased heat exchange. In various embodiments, the contact plate 42, a fin lateral surface 44, fin extending surface 46, fin end surface 48 or combinations thereof are fullerene coated as shown in FIG. 1 to provide improved heat dissipation. A thermal grease or similar material can be applied at the interface of the switch module contact plate 42 and the heat sink 26 to provide improved thermal conductivity. In other embodiments, the thermal grease is eliminated and a contact plate 42 is provided with a fullerene coating or the switch module 32 is in direct or close contact with a heat sink fullerene coated surface to provide improved thermal dissipation.

FIG. 3 shows another thermal energy generating component and thermal dissipating device combination. In this embodiment, central processing unit 50 comprises a printed circuit board 52, an adapter 54 and a thermal dissipating device 70. The adapter 54 is formed of an electrically insulative material, such as an ABS plastic. The adapter 54 has depending top wall 56 and opposed side walls 58, 60. Side walls 58, 60 are formed with laterally inwardly extending lips 62, 64. The lips 62, 64 form a groove with top wall 56 adapted to capture outer extremities or marginal portions of a solid state device such as printed circuit board 52.

The printed circuit board 52 is inserted into adapter 54 with outer marginal portions received between lips 62, 64 so that its central portion is aligned with threaded bore 68 and in contact with a threaded central insert 72 of heat sink 70. The threaded central insert 72 of heat sink 70 is screwed into threaded bore 68 until it bottoms out against the printed circuit board 52. In this embodiment, the heat sink 70 is a passive device that acts like a radiator to conduct heat away from the printed circuit board 52.

In the FIG. 3 embodiment, heat sink 70 is formed of a structural material. The sink 70 comprises a plurality of thin members 74 extending integrally from a core having threaded insert 72 adapted to be threadingly received in threaded bore 68. Thermal conductivity is imparted to the heat sink 72 by a fullerene coating that is applied to a surface of the thin members 74, to a surface of the insert 72, to a surface of the threaded bore 68 or to combinations of surfaces of the thin members, insert or adapter 12. Again, a thermally conductive grease, such as a silicon based grease or a flexible heat conductive tape can be applied between insert 72 and printed circuit board 52 to further enhance heat dissipation.

The FIG. 4 microprocessor assembly 80 comprises a printed circuit board 82, a fan 84 and fullerene coated heat sink 86. The heat sink 86 sits on the top of the printed circuit board 82 and has fins between which air can pass. The bottom 88 of the heat sink 86 is of a flat surface so that the heat sink 86 can be in close contact with the top 90 of printed circuit board 82. Any or all of the fins can be fullerene coated as shown in FIG. 1 in accordance with the invention. The fan 84 is screwed or otherwise secured on the top of the heat sink 86. The printed circuit board 82 is mounted in contact with the heat sink 86 and electrically connected to a service device, which can be a computer, processor, controller or the like.

In general, large motors or high speed microprocessors require larger heat sinks 26, 70, 86 to dissipate increased heat generated by larger components. The improved heat dissipating capacity imparted by the fullerene coating means that motor size or the size of any heat generating structure can be increased without requiring an enlarged associated heat sink. The applied fullerene coating, which can be applied in a layer as thin as a single molecule, i.e., one nanometer, adds no significant bulk to the combined structure.

While preferred embodiments of the invention have been described, the present invention is capable of variation and modification and therefore should not be limited to the precise details of the Examples. The invention includes changes and alterations that fall within the purview of the following claims.

What is claimed is:

1. A method of producing an electronic module, comprising:
   applying a fullerene coating to a first higher melting temperature substrate to produce a first fullerene coated substrate;
   contacting the first fullerene coated substrate with a lower melting temperature substrate with a first surface in contact with an exposed fullerene surface of the fullerene coated substrate to form a two substrate structure with intermediate fullerene coating between the substrates;
   applying a second fullerene coating to an exposed surface of the second substrate;
   cleaving the intermediate fullerene coating between the two substrates to produce two fullerene coated substrates, at least one of which is the lower melting temperature substrate;
   providing a thermal energy generating component; and
   associating a thermal dissipating device comprising at least one of the fullerene coated substrates into thermal conductive contact with the component.

2. The method of claim 1, wherein applying a fullerene coating comprises:
heating a fullerene under pressure conditions to cause the fullerene to sublime; and
condensing the sublimed fullerene onto the substrate to form the fullerene coated substrate.

3. The method of claim 1, further comprising incorporating the coated lower melting temperature substrate or incorporating the higher melting temperature substrate as part of an electronic module in thermal conductive contact with the thermal energy generating component.

4. The method of claim 1, comprising: associating the thermal dissipating device into thermal conductive contact with the component in a manner to dissipate heat away from the component.

5. The method of claim 1, comprising: associating the thermal dissipating device into thermal conductive contact with the component, adjacent the component and otherwise exposed to an ambient environment, to dissipate heat away from the component to the ambient environment.

6. The method of claim 1, wherein at least one fullerene coating is applied by a Langmuir-Blodgett technique or by a solution evaporation technique.

7. The method of claim 1, wherein at least one fullerene coating is applied by sublimation.

8. The method of claim 1, wherein at least one fullerene coating is deposited by subliming the fullerene by heating to a temperature greater than about 450° C. under low pressure.

9. The method of claim 1, wherein at least one fullerene coating is applied by subliming the fullerene by heating to a temperature greater than about 450° C. under a pressure less than about $1 \times 10^{-6}$ torr.

10. The method of claim 1, wherein at least one fullerene coating is applied by subliming the fullerene by heating to a temperature from about 450° C. to about 550° C. at a pressure less than about $1 \times 10^{-8}$ torr.

11. The method of claim 1, wherein a fullerene is heated to a first temperature from about 200° C. to about 350° C. and then heated at a reduced pressure at a higher temperature to sublime the fullerene to coat the second substrate.

12. The method of claim 1, wherein at least one substrate exposure time and sublimation conditions are controlled to provide a target fullerene coating thickness.

13. The method of claim 1, wherein at least one fullerene coating is applied by sublimation from a solution.

14. The method of claim 1, wherein the at least one fullerene coating is applied by dissolving in toluene, loading the resulting solution into a resistively heated oven; placing the oven into a vacuum chamber, evacuating to approximately $10^{-6}$ Torr. and heating the oven to about at least 450° C. to sublime the fullerene from the solvent onto the substrate surface.

15. The method of claim 1 wherein at least one fullerene coating is applied by depositing a coating of fullerene molecules onto the substrate and removing layers of the coating to produce a residual layer of desired thickness.

16. The method of claim 1, wherein at least one fullerene coating is applied by depositing a coating of fullerene molecules onto the substrate and removing layers of the coating to produce a residual layer of desired thickness by selectively breaking fullerene-to-fullerene intermolecular bonds without breaking fullerene-to-substrate bonding.

17. The method of claim 1, wherein at least one fullerene coating is applied by depositing a coating of fullerene molecules onto the substrate by sublimation in a vacuum chamber and removing layers of the coating in the same chamber to produce a residual layer of desired thickness by selectively breaking fullerene-to-fullerene intermolecular bonds without breaking fullerene-to-substrate bonding.

18. The method of claim 1, wherein at least one substrate is cleaned and the fullerene coating is applied onto the substrate in the same chamber.

\* \* \* \* \*